United States Patent
Yi et al.

(10) Patent No.: US 7,102,173 B2
(45) Date of Patent: Sep. 5, 2006

(54) NITRIDE SEMICONDUCTOR DEVICE AND METHOD OF MANUFACTURING THE SAME

(75) Inventors: Gyu-Chul Yi, Pohang-Shi (KR); Sung Jin An, Pohang-Shi (KR); Yong Jin Kim, Gumi-Shi (KR)

(73) Assignees: Siltron Inc., Gyeongsangbuk-Do (KR); Postech Foundation, Pohang-Shi (KR)

( * ) Notice: Subject to any disclaimer, the term of this patent is extended or adjusted under 35 U.S.C. 154(b) by 0 days.

(21) Appl. No.: 11/074,413

(22) Filed: Mar. 8, 2005

(65) Prior Publication Data

US 2005/0199886 A1 Sep. 15, 2005

(30) Foreign Application Priority Data

Mar. 10, 2004 (KR) ............... 10-2004-0016093
Feb. 16, 2005 (KR) ............... 10-2005-0012854

(51) Int. Cl.
*H01L 31/296* (2006.01)

(52) U.S. Cl. ......... 257/79; 257/E25.019; 257/E25.028; 977/759

(58) Field of Classification Search ............ 438/22, 438/27, 28, 31, 34, 35, 46, 63, 64, 65, 77; 977/701, 759, 761, 762, 811, 815, 816, 819, 977/825, 700, 755; 257/13, 79, E25.019, 257/E25.028
See application file for complete search history.

(56) References Cited

U.S. PATENT DOCUMENTS

2004/0079278 A1* 4/2004 Kamins et al. ............... 117/84
2004/0175844 A1* 9/2004 Yang et al. ................... 438/2

OTHER PUBLICATIONS

W.I. Park, et al., Metalorganic Vapor-Phase Epitaxial Growth of Vertically Well-Aligned ZnO Nanorods, Applied Physics Letter, vol. 80, No. 22, pp. 4232-4234 (2002).

* cited by examiner

*Primary Examiner*—Brook Kebede
(74) *Attorney, Agent, or Firm*—Marshall, Gerstein & Borun LLP

(57) ABSTRACT

Provided are a nitride semiconductor device and method of manufacturing the same. In the method, semiconductor nanorods are vertically grown on a substrate, and then a nitride semiconductor thin film is deposited on the substrate having the semiconductor nanorods. Accordingly, a high-quality nitride semiconductor thin film can be deposited on a variety of inexpensive, large-sized substrates. Also, because the nitride semiconductor thin film containing the semiconductor nanorods can easily emit light through openings between the nanorods, internal scattering can be greatly reduced. Thus, the nitride semiconductor thin film can be usefully employed in optical devices such as light emitting diodes and electronic devices.

35 Claims, 6 Drawing Sheets

NITRIDE SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly, to a nitride semiconductor device having high optical efficiency and a method of manufacturing the same.

2. Description of the Related Art

In recent years, owing to increased demand for blue-wavelength light emitting diodes, GaN thin films have become strongly relied upon. As is well known to those skilled in the art, a nitride semiconductor thin film, such as the GaN film, is typically deposited on a sapphire ($Al_2O_3$) substrate.

However, when a light emitting diode is manufactured using the nitride semiconductor thin film grown on the sapphire substrate, it has high internal quantum efficiency (QE), but low optical efficiency (OE) due to optical emission restrictions caused by internal scattering. Also, in the conventional manufacturing process of nitride semiconductor thin films, since an expensive and small-sized sapphire substrate is used, the resulting nitride semiconductor thin film has a small size of 2 inches or less, the cost of production is high, and yield is low. These problems should be solved in order to popularize white light emitting diodes for indoor illumination.

SUMMARY OF THE INVENTION

The present invention provides a nitride semiconductor device having high optical efficiency.

The present invention also provides a method of manufacturing a nitride semiconductor device, which can employ a variety of substrates and deposit a nitride semiconductor thin film having high optical efficiency and good quality on a large-sized substrate.

According to an aspect of the present invention, there is provided a nitride semiconductor device including a substrate; a plurality of semiconductor nanorods grown on the substrate and having a rod shape; and a nitride semiconductor thin film deposited and distributed on and between the semiconductor nanorods to emit ultraviolet rays, visible rays, or infrared rays.

According to another aspect of the present invention, there is provided a method of manufacturing a nitride semiconductor device including: preparing a substrate; vertically forming a plurality of semiconductor nanorods having a rod shape on the substrate by causing a chemical reaction between predetermined precursors; and depositing a nitride semiconductor thin film on the substrate having the semiconductor nanorods using the semiconductor nanorods as seeds, the nitride semiconductor thin film emitting ultraviolet rays, visible rays, or infrared rays.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
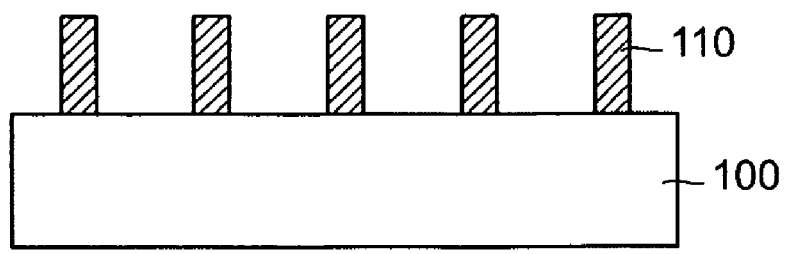
FIGS. 1A through 1C are cross-sectional views illustrating a method of manufacturing a GaN thin film according to an exemplary embodiment of the present invention.

The present invention will now be described more fully with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. It will also be understood that when a layer is referred to as being "on" another layer or substrate, it can be directly on the other layer or substrate or intervening layers may also be present. In the drawings, the thickness of layers and regions may be exaggerated for clarity. The same reference numerals are used to denote the same elements throughout the specification.

In the exemplary embodiments of the present invention, unlike a conventional method in which a nitride semiconductor thin film is deposited directly on a substrate, semiconductor nanorods are vertically grown on a substrate and then a nitride semiconductor thin film is deposited thereon. Thus, the nitride semiconductor thin film containing the semiconductor nanorods is obtained.

Figure 1B:
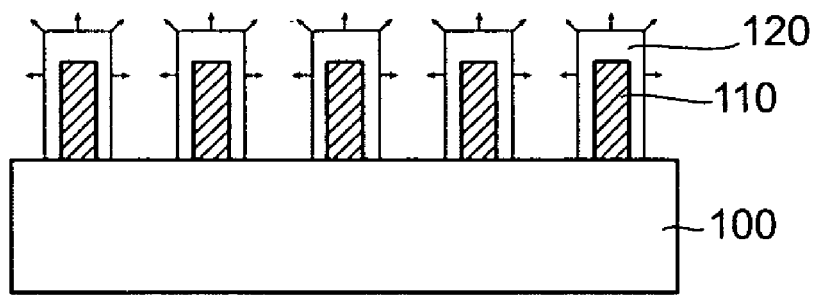
Figure 1C:
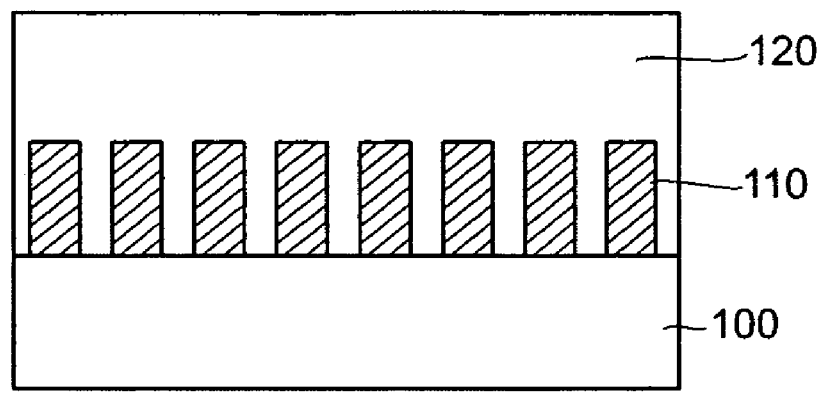

FIGS. 1A through 1C are cross-sectional views illustrating a method of forming a GaN thin film 120 on a substrate 100 e.g., a silicon substrate having semiconductor nanorods 110 e.g., ZnO nanorods. Specifically, FIG. 1A illustrates a process of growing the ZnO nanorods 110 on the substrate 100 (here, the ZnO nanorods 110 are typically grown in a vertical direction with respect to the plane of the substrate 100), FIG. 1B illustrates a process of growing the GaN thin film 120 using the ZnO nanorods 110 as seeds, and FIG. 1C illustrates the resultant GaN thin film 120 containing the ZnO nanorods 110.

In the exemplary embodiments of the present invention, the semiconductor nanorods 110 may be formed of an oxide semiconductor such as ZnO and $In_2O_3$, a nitride semiconductor such as GaN, a carbide semiconductor such as SiC, a III-V or II-VI group compound semiconductor such as GaAs, GaP, InP, GaInP, and AlGaAs, or a silicon semiconductor. Also, the semiconductor nanorods 110 may further include a variety of organic or inorganic materials, for example, at least one different element selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, and H.

In the exemplary embodiments of the present invention, the growth of the semiconductor nanorods 110 on the substrate 100 may be performed using a chemical vapor deposition (CVD) process such as a metal organic chemical vapor deposition (MOCVD) process, a physical growth method such as a sputtering process, a thermal or electron beam (e-beam) evaporation process, and a pulse laser deposition (PLD) process, or a vapor-phase transport process using a metal catalyst e.g., gold. Preferably, the semiconductor nanorods 110 are formed using the MOCVD process. The semiconductor nanorods 110, which are vertically grown on the substrate 100, have a diameter of 1 to 1000 nm and a length of 10 nm to 100 µm. The semiconductor nanorods 110 grown on the substrate 100 are arranged at random.

A method of forming the semiconductor nanorods 110 using the MOCVD process will now be described. First of all, the substrate 100 is loaded in a reactor, and reactive precursors e.g., a first reactive precursor and a second reactive precursor are each injected into the reactor using a carrier gas. A chemical reaction between the first and second reactive precursors occurs at a predetermined temperature under a predetermined pressure, thus growing the semiconductor nanorods 110 having a rod shape on the substrate 100. For example, when the first reactive precursor is $Zn(CH_3)_2$ and the second reactive precursor is $O_2$, ZnO nanorods can be obtained. The predetermined temperature may range from 400 to 900° C., and the predetermined pressure may range from $10^{-5}$ to 760 mmHg.

In alternative embodiments of the present invention, the substrate 100 for growing the semiconductor nanorods 110 may be not only a sapphire substrate but also any kind of substrate that enables growth of nanorods. For instance, the substrate 100 may be a silicon substrate, a glass substrate, a silicon oxide ($SiO_2$) substrate, an indium tin oxide (ITO) substrate, a quartz substrate, or a metal substrate. The metal substrate may be formed of Au, Pt, Al, Ni, Ti, Pd, or an alloy thereof.

As described above, the nitride semiconductor thin film 120 is deposited on the semiconductor nanorods 110 that are grown on the substrate 100, thereby completing the nitride semiconductor thin film 120 containing the semiconductor nanorods 110 according to the present invention.

The deposition of the nitride semiconductor thin film 120 on the semiconductor nanorods 110 can be preformed using an MOCVD process, a molecular beam epitaxy (MBE) process, or a hydride vapor phase epitaxy (HVPE) process.

Figure 2:
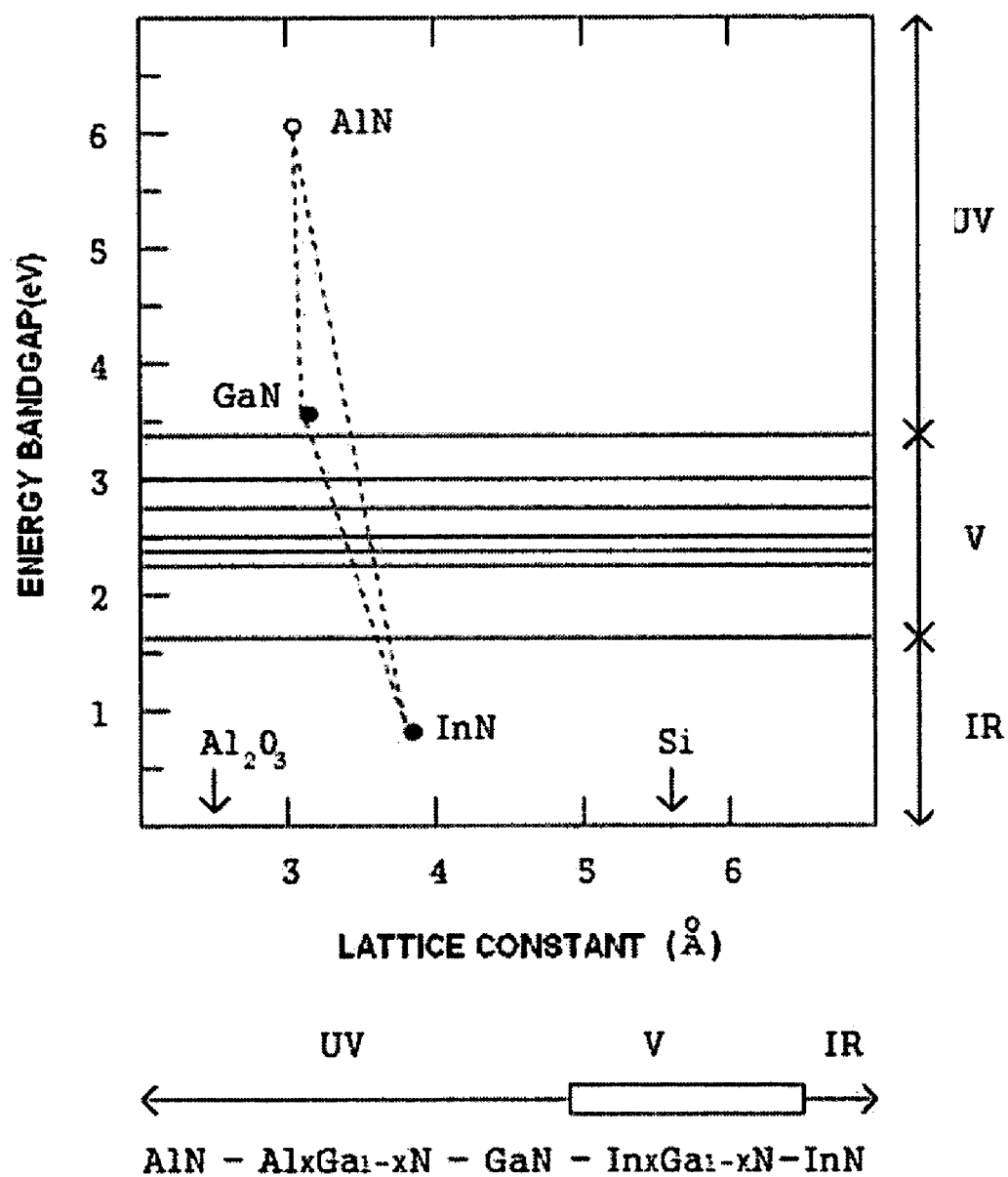
FIG. 2 is a graph of a lattice constant versus an energy bandgap of each of a plurality of nitride semiconductor thin films.

In the exemplary embodiments of the present invention, the nitride semiconductor thin film 120 may be formed of, for example, GaN, AlN, InN, or an alloy thereof (e.g., $Ga_{1-x}Al_{1-y}In_{1-z}N$, $0 \leq x, y, z \leq 1$). During the deposition of the nitride semiconductor thin film 120, In or Al may be separately, simultaneously, or sequentially injected into the reactor so that a thin film formed of InN, AlN, InGaN, AlGaN, or InGaAlN may be grown. As a result, a bandgap of the thin film can be adjusted to 1.9 to 6.2 eV. As is known, a GaN thin film has a bandgap of about 3.4 eV, an AlN thin film has a bandgap of about 6.2 eV, and an InN thin film has a bandgap of about 0.7 eV (refer to FIG. 2). FIG. 2 is a graph of lattice constant versus energy bandgap of each of the foregoing nitride semiconductor thin films. Referring to FIG. 2, AlN has a bandgap of 6.2 eV and emits ultraviolet (UV) rays, $Al_xGa_{1-x}N(0<x<1)$ has a smaller bandgap than AlN and emits UV rays, GaN has a smaller bandgap than $Al_xGa_{1-x}N(0<x<1)$, $In_xGa_{1-x}N(0<x<1)$ has a smaller bandgap than GaN and emits visible (V) rays, and InN has a bandgap of 0.7 eV which is smaller than $In_xGa_{1-x}N(0<x<1)$, and emits infrared (IR) rays.

During the deposition of the nitride semiconductor thin film 120, at least one different element selected from the group consisting of Si, Ge, Mg, Zn, O, Se, Mn, Ti, Ni, and Fe according to purpose is injected into the reactor so that the nitride semiconductor thin film 120 may further include different elements. These different elements may be selectively added at users' request in order to change the electrical, optical, or magnetic properties of the nitride semiconductor thin film 120. The addition of the different elements may be performed using an in-situ doping process, an ex-situ doping process, or an implantation process. In the in-situ doping process, desired elements are added during growth of the thin film. The ex-situ doping process is a method in which after a nitride semiconductor thin film is grown, different elements are implanted into the nitride semiconductor thin film using thermal or plasma treatment. Also, the ion implantation process accelerates the desired elements to make the elements collide with a nitride semiconductor thin film, thereby enabling implantation of the elements into the nitride semiconductor thin film. Among the above-described elements, Si, Ge, and Zn are dopants for an n-type nitride semiconductor thin film, Mg is a dopant for a p-type nitride semiconductor thin film, and Mn, Ni, and Fe are dopants for a magnetic nitride semiconductor thin film.

Figure 3A:
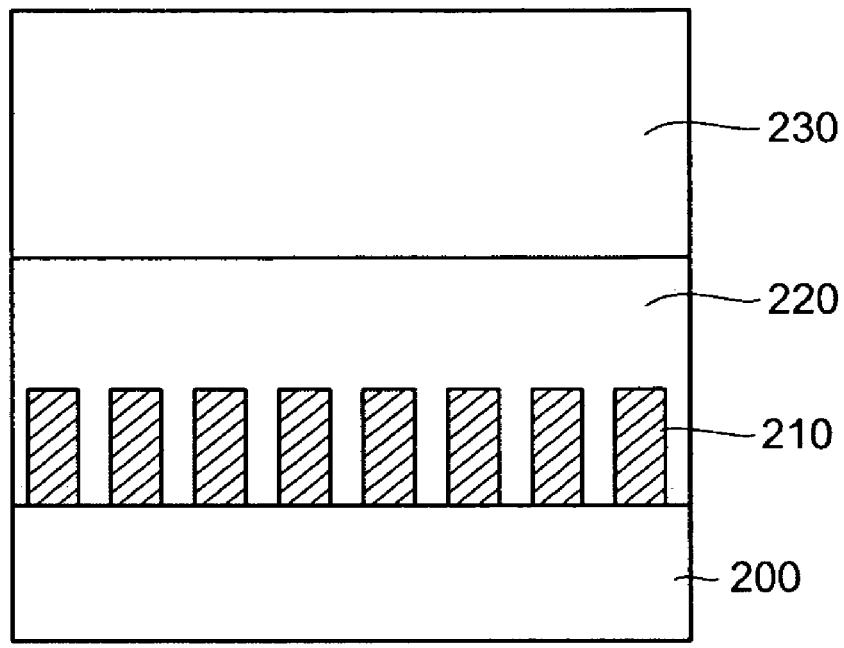
FIGS. 3A and 3B are cross-sectional views of examples of a light emitting diode using a GaN thin film containing ZnO nanorods formed on a silicon substrate, according to exemplary embodiments of the present invention.
Figure 3B:
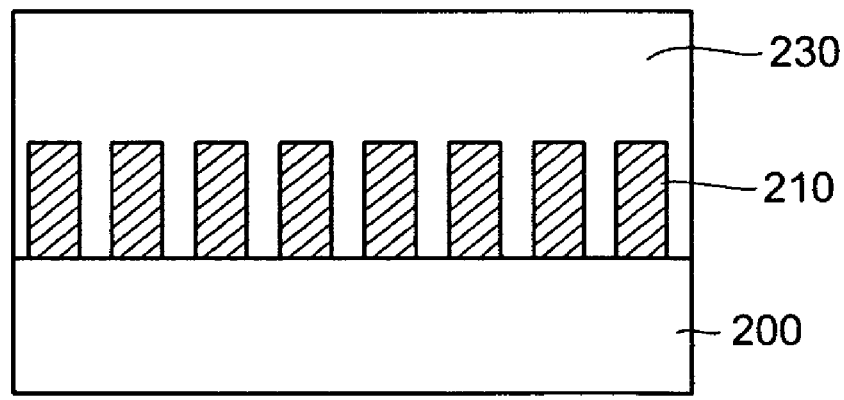

Further, the nitride semiconductor thin film 120 may be formed as a p-n junction type as shown in FIG. 3A. FIGS. 3A and 3B are cross-sectional views of examples of a light emitting diode using a GaN thin film containing ZnO nanorods formed on a silicon substrate according to exemplary embodiments of the present invention. Specifically, FIG. 3A illustrates formation of a GaN thin film as a p-n heterojunction type, and FIG. 3B illustrates formation of a GaN thin film as a p type. In FIGS. 3A and 3B, reference numeral "200" refers to a substrate, reference numeral "210" refers to n-type ZnO nanorods, "220" refers to an n-type GaN thin film, and "230" refers to a p-type GaN thin film.

Preferably, semiconductor nanorods and a nitride semiconductor thin film are formed of materials having the same crystalline structure. Because the nitride semiconductor thin film is grown using the semiconductor nanorods as seeds, when the semiconductor nanorods and the nitride semiconductor thin film are formed of materials having the same crystalline structure, the nitride semiconductor thin film can have a high quality. Also, the semiconductor nanorods and the nitride semiconductor thin film are formed of materials having a lattice constant difference of 20% or less because a large lattice constant difference is an obstacle in obtaining a uniform, high-quality thin film. For example, the lattice constant difference between sapphire ($Al_2O_3$) and a GaN thin film is about 13%, and the lattice constant difference between silicon (Si) and the GaN thin film is about 17%. Thus, it is necessary to select appropriate materials for the semiconductor nanorods and the nitride semiconductor thin film in consideration of their crystalline structure and lattice constant difference.

A process of forming a nitride semiconductor thin film using MOCVD will now be described. At the outset, a substrate having semiconductor nanorods is loaded into a reactor, and a reactive precursor and a nitride source gas are injected into the reactor using respective carrier gases. Thereafter, a chemical reaction between the reactive precursor and the nitride source gas occurs at a predetermined temperature under a predetermined pressure, thus depositing a nitride semiconductor thin film. The reactive precursor may be trimethylgalium(TMGa), triethylgalium(TEGa), or $GaCl_3$, and the nitride source gas may be $NH_3$, $N_2$, or tertiarybutylamine($N(C_4H_9)H_2$). The predetermined temperature may range from 300 to 1100° C., and the predetermined pressure may range from $10^{-5}$ to 2000 mmHg. The nitride semiconductor thin film may be grown using the semiconductor nanorods as seeds in vertical and horizontal directions with respect to the plane of the substrate. As a result, the nitride semiconductor thin film grows from the seeds and combines to form a continuous thin film. Here, the thickness of the nitride semiconductor thin film can be appropriately controlled in consideration of a desired level of quality or some other specification.

Further, the nitride semiconductor thin film may have various structures according to the time taken to grow the thin film, the growth order, and the number of repeated processes. Also, the nitride semiconductor thin film can be deposited on not only a sapphire substrate, which is expensive and an insulator, but various substrates, for example, a glass substrate, which is inexpensive and transparent, or a silicon substrate, which is a semiconductor material. Hence, the nitride semiconductor thin film can be manufactured on a large-sized substrate of 12 inches or more and also reduce the cost of production to about 1/40 of that of a conventional method, so that the range of applications of devices using the nitride semiconductor thin film can be remarkably expanded.

Moreover, because the nitride semiconductor thin film containing semiconductor nanorods according to the exemplary embodiments of the present invention can easily emit light through openings between the nanorods, the effects of internal scattering can be greatly reduced. Thus, the nitride semiconductor thin film can be usefully employed in optical devices such as light emitting diodes.

In another case, after the nitride semiconductor thin film is formed using the semiconductor nanorods as the seeds, by using the resultant nitride semiconductor thin film as a substrate, a thick compound semiconductor film may be additionally deposited thereon using an HVPE process. In this case, after the thick compound semiconductor film is formed, the nitride semiconductor thin film used as the substrate may be cut out or all regions excluding the thick compound semiconductor film may be removed using a polishing or grinding process. Thus, it is possible to select and use only a uniform, high-quality compound semiconductor film grown on the substrate.

A method of forming a thick GaN film on a compound semiconductor thin film using an HVPE process will now be described. To begin, a container containing Ga is loaded in a reactor and heated using a heater installed around the container so that the Ga melts into Ga liquid. A reaction between the Ga liquid and HCl occurs, generating GaCl gas as shown in Equation 1:

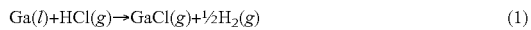
$$\mathrm{Ga}(l)+\mathrm{HCl}(g)\rightarrow\mathrm{GaCl}(g)+\tfrac{1}{2}\mathrm{H}_2(g) \qquad (1)$$

Thereafter, a reaction between the GaCl gas and $NH_3$ occurs, forming a GaN film as shown in Equation 2:

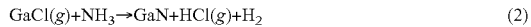
$$\mathrm{GaCl}(g)+\mathrm{NH}_3\rightarrow\mathrm{GaN}+\mathrm{HCl}(g)+\mathrm{H}_2 \qquad (2)$$

Then, a reaction between unreacted gases occurs as shown in Equation 3 so that the unreacted gases are exhausted from the container:

$$\mathrm{HCl}(g)+\mathrm{NH}_3\rightarrow\mathrm{NH}_4\mathrm{Cl}(g) \qquad (3)$$

This HVPE process enables growth of thick films at a high rate of about 100 μm/hr and exhibits high productivity.

Several exemplary embodiments of the present invention will now be described in more detail. The following disclosure is provided for illustrative purposes only and should not be construed as limiting the present invention.

EMBODIMENT

A process of forming ZnO nanorods will now be described by giving a specific example. At the outset, reactive precursors (i.e., $Zn(CH_3)_2$ and $O_2$) were injected through separate lines into a reactor at flow rates of 0.1 to 10 sccm and 10 to 100 sccm, respectively, using Ar as a carrier gas. A chemical reaction between the $Zn(CH_3)_2$ and $O_2$ occurred on a silicon substrate, thus growing ZnO nanorods in a vertical direction with respect to the plane of the silicon substrate, as shown in FIG. 1A. While the ZnO nanorods are being grown over about 1 hour, the reactor was maintained at a pressure of $10^{-5}$ to 760 mmHg and a temperature of 400 to 900° C. After the growth of the ZnO nanorods was finished, each of the ZnO nanorods grown on the silicon substrate had a diameter of about 1 to 1000 nm and a length of about 10 nm to 100 μm.

A process of forming SiC nanorods will now be described by giving a specific example. At first, a metal catalyst e.g., Au, Ni, or Fe was coated on a substrate e.g., a silicon substrate, a sapphire substrate, or a glass substrate to a thickness of about 10 to 300 Å using an e-beam evaporator, and the resultant structure was loaded into a tube electric furnace. While Ar gas is injected into the electric furnace at a flow rate of about 500 sccm, the temperature of the electric furnace was raised to a desired temperature of about 1100° C. When the electric furnace attained the desired temperature, methane gas and hydrogen gas were injected into the electric furnace at flow rates of 40 sccm and 500 sccm, respectively, for 30 minutes, thus causing a reaction between the methane gas and the hydrogen gas. After a predetermined amount of time (about 30 minutes), Ar gas was injected into a quartz tube at a flow rate of 500 sccm until the electric furnace is cooled down to a room temperature. Thereafter, when the substrate was unloaded from the electric furnace, it could be confirmed that the substrate turned blue or gray. Compound SiC nanorods are grown to a length of about 1 to 500 μm and a diameter of about 10 to 60 nm according to the time allowed for growing. As a result, the compound SiC nanorods of high purity and high density are vertically oriented and grown on the substrate. Components of the compound SiC nanorods can be analyzed using an energy dispersive x-ray spectrometer (EDS), and the result is that the compound SiC nanorods are formed in a ratio of 1(Si):1(C) and include a very small amount of metal catalyst element.

A method of depositing a GaN thin film will now be described by giving a specific example. At first, TMGa gas and $NH_3$ gas were injected through separate lines into a reactor at flow rates of 1 to 50 sccm and 100 to 2000 sccm, respectively. While the reactor is maintained at a temperature of 300 to 1100° C. under a pressure of $10^{-5}$ to 2000 mmHg, a chemical reaction between the reactive precursors occurred in the reactor for 60 minutes, thus growing GaN on ZnO nanorods as shown in FIG. 1B. As a result, the GaN thin film containing the ZnO nanorods was manufactured as shown in FIG. 1C.

Figure 4A:
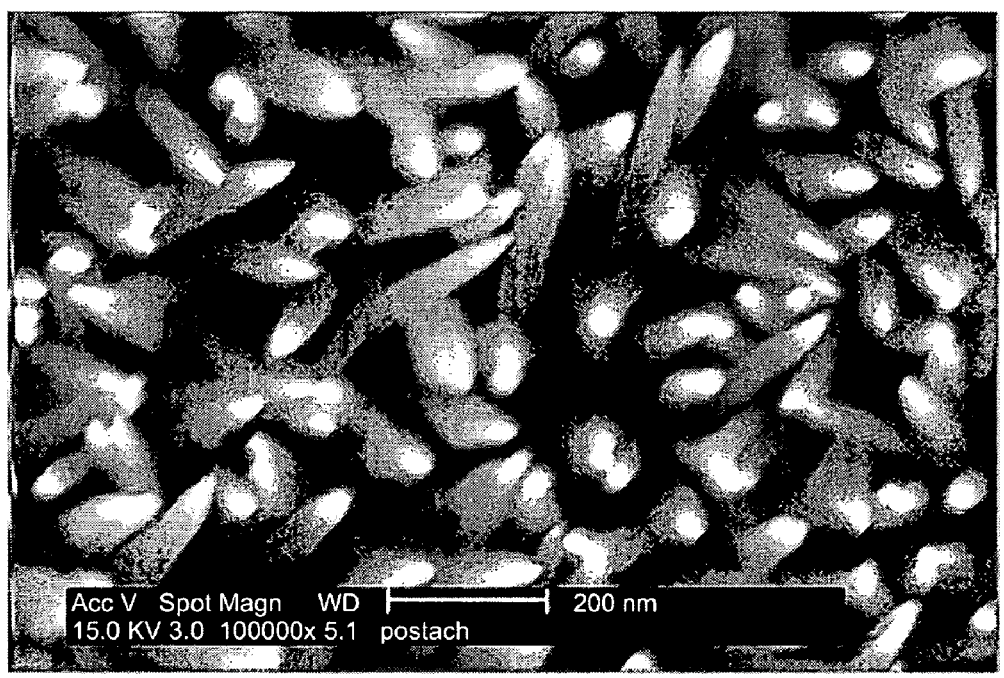
FIGS. 4A through 4C are scanning electron microscope (SEM) images of a GaN thin film containing ZnO nanorods according to an exemplary embodiment of the present invention.
Figure 4B:
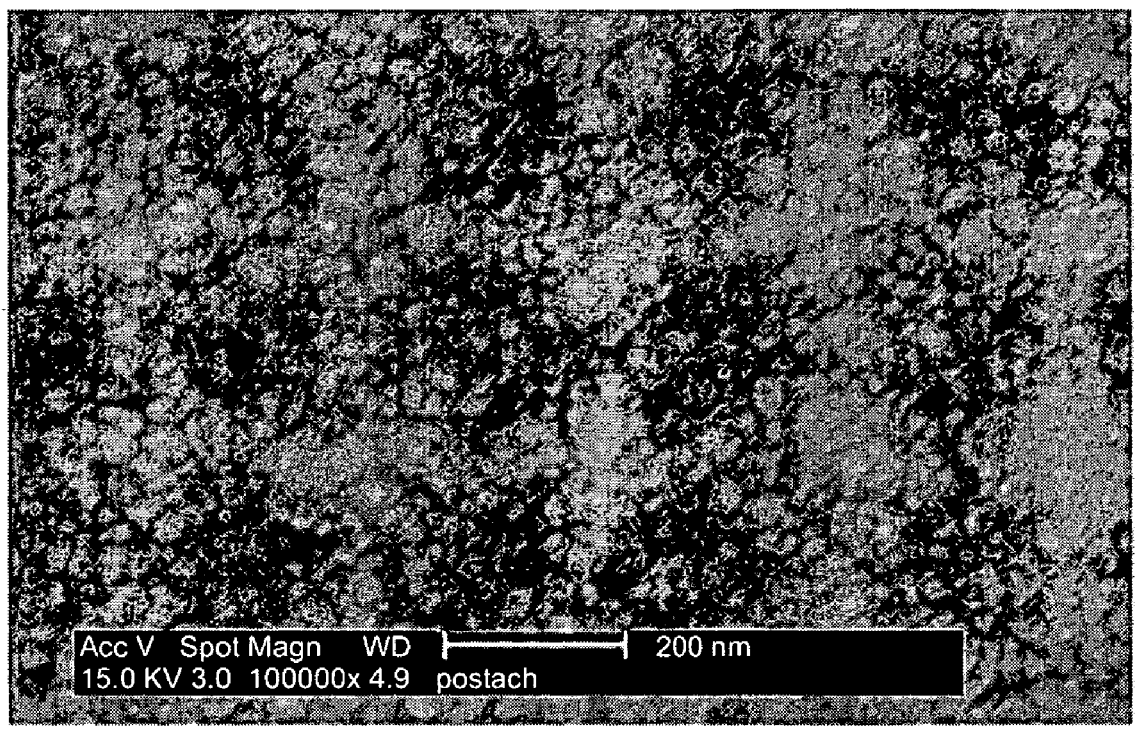
Figure 4C:
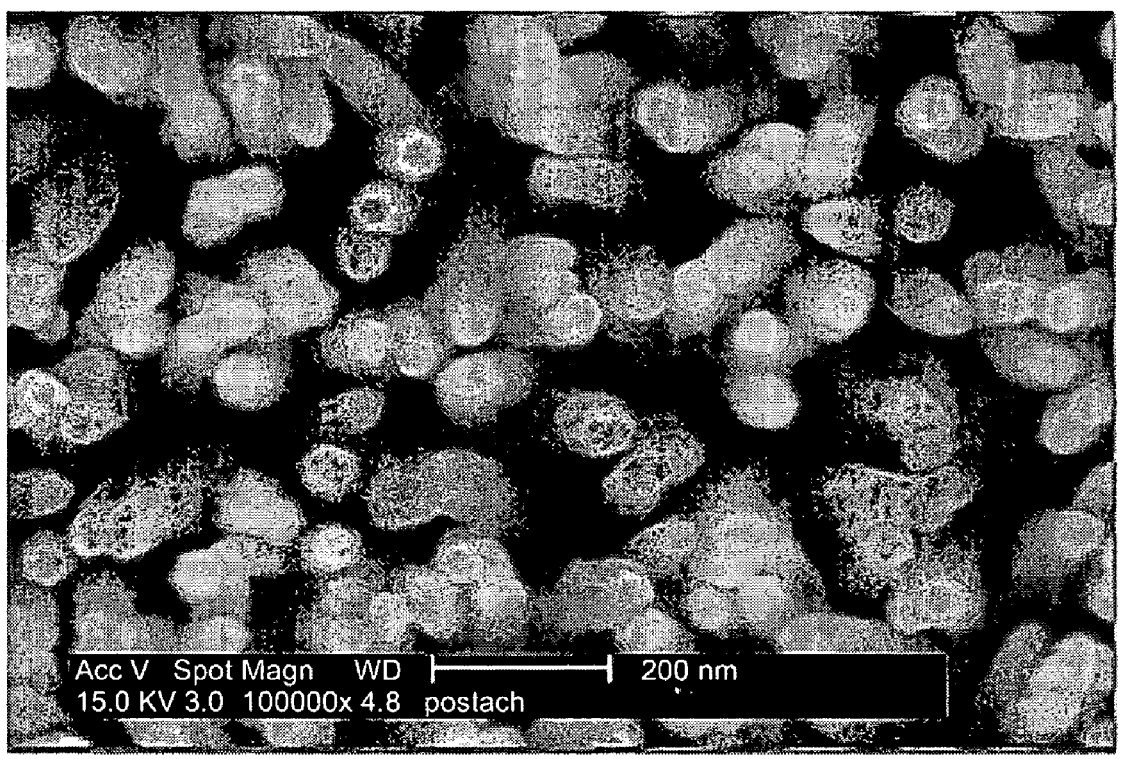

FIGS. 4A through 4C are scanning electron microscope (SEM) images and a transmission electron microscope (TEM) image of a GaN thin film containing ZnO nanorods manufactured by the above-described method. FIG. 4A is an SEM image of ZnO nanorods that are vertically grown on a silicon substrate, and FIGS. 4B and 4C are an SEM image and a TEM image, respectively, of a GaN thin film that is deposited using the ZnO nanorods as seeds. It can be observed from FIGS. 4B and 4C that the GaN thin film is successfully deposited and takes on the shape shown in FIG. 1C.

Also, the GaN thin film containing the ZnO nanorods has a high quality because ZnO and GaN have not only the same crystalline structure but also a lattice constant difference of only 1.8%.

According to the exemplary embodiments of the present invention described above, a nitride semiconductor thin film is formed using semiconductor nanorods as seeds. In this method, in addition to an expensive sapphire substrate, various other inexpensive kinds of substrate can be utilized. Thus, a large-sized device can be manufactured, yield can be improved, and manufacturing cost can be greatly reduced. Further, the nitride semiconductor thin film containing the semiconductor nanorods manufactured according to the present invention, exhibits very high optical efficiency and can be applied to a variety of devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nitride semiconductor device comprising:
   a substrate;
   a plurality of semiconductor nanorods grown on the substrate and having a rod shape; and
   a nitride semiconductor thin film deposited and distributed on and between the semiconductor nanorods to emit ultraviolet rays, visible rays, or infrared rays,
   wherein the thickness of the nitride semiconductor thin film is larger than the length of the semiconductor nanorods, and the semiconductor nanorods reduce an internal scattering of the rays emitted from the nitride semiconductor thin film filled between the semiconductor nanorods and increase optical efficiency.

2. The device according to claim 1, wherein the semiconductor nanorods and the nitride semiconductor thin film have the same crystalline structure.

3. The device according to claim 1, wherein a lattice constant difference between the semiconductor nanorods and the nitride semiconductor thin film is 20% or less.

4. The device according to claim 2, wherein the semiconductor nanorods are formed of ZnO, the nitride semiconductor thin film is formed of GaN, the semiconductor nanorods and the nitride semiconductor thin film have the same crystalline structure, and the lattice constant difference between the semiconductor nanorods and the nitride semiconductor thin film is 1.8%.

5. The device according to claim 1, wherein the semiconductor nanorods are arranged at random in a vertical direction with respect to the plane of the substrate.

6. The device according to claim 1, wherein the semiconductor nanorods are formed of a semiconductor selected from the group consisting of an oxide semiconductor, a nitride semiconductor, a carbide semiconductor, a Ill-V group compound semiconductor, a Il-VI group compound semiconductor, and a silicon semiconductor.

7. The device according to claim 6, wherein the semiconductor nanorods further comprise at least one different element selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, and H.

8. The device according to claim 1, wherein each of the semiconductor nanorods has a diameter of 1 to 1000 nm and a length of 10 nm to 100 μm.

9. The device, according to claim 1, wherein the nitride semiconductor thin film is formed of a material selected from the group consisting of GaN, AlN, InN, and an alloy thereof.

10. The device according to claim 9, wherein the nitride semiconductor thin film further comprises at least one different element selected from the group consisting of Si, Ge, Mg, Zn, O, Se, Mn, Ti, Ni, and Fe.

11. The device according to claim 1, wherein the substrate is selected from the group consisting of a silicon substrate, a glass substrate, a silicon oxide substrate, a sapphire substrate, an indium tin oxide substrate, a quartz substrate, and a metal substrate.

12. A method of manufacturing a nitride semiconductor device, comprising:
    preparing a substrate;
    vertically forming a plurality of semiconductor nanorods having a rod shape on the substrate by causing a chemical reaction between predetermined reactive precursors; and
    depositing a nitride semiconductor thin film on the substrate having the semiconductor nanorods using the semiconductor nanorods as seeds to grow the semiconductor thin film in vertical and horizontal directions with respect to the plane of the substrate, the nitride semiconductor thin film emitting ultraviolet rays, visible rays, or infrared rays,
    wherein the nitride semiconductor thin film is formed to be thicker than the length of the semiconductor nanorods, and the semiconductor nanorods reduce an internal scattering of the rays emitted from the nitride semiconductor thin film filled between the semiconductor nanorods and increase optical efficiency.

13. The method according to claim 12, wherein the semiconductor nanorods and the nitride semiconductor thin film are formed of materials having the same crystalline structure.

14. The method according to claim 12, wherein the semiconductor nanorods and the nitride semiconductor thin film are formed of materials having a lattice constant difference of 20% or less.

15. The method according to claim 13, wherein the semiconductor nanorods are formed of ZnO, the nitride semiconductor thin film is formed of GaN, and the semiconductor nanorods and the nitride semiconductor thin film are formed of materials having the same crystalline structure and a lattice constant difference of 1.8%.

16. The method according to claim 12, wherein the semiconductor nanorods are grown to be arranged at random in a vertical direction with respect to the plane of the substrate.

17. The method according to claim 12, wherein the semiconductor nanorods are formed of a semiconductor selected from the group consisting of an oxide semiconductor, a nitride semiconductor, a carbide semiconductor, a Iii-V group compound semiconductor, a Ii-VI group compound semiconductor, and a silicon semiconductor.

18. The method according to claim 17, wherein the semiconductor nanorods are formed by adding at least one different element selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, and H.

19. The method according to claim 12, wherein each of the semiconductor nanorods is formed to a diameter of 1 to 1000 nm and a length of 10 nm to 100 μm.

20. The method according to claim 12, wherein the nitride semiconductor thin film is formed of a material selected from the group consisting of GaN, ALN, InN, and an alloy thereof.

21. The method according to claim 20, wherein the nitride semiconductor thin film is formed by adding at least one different element selected from the group consisting of Si, Ge, Mg, Zn, O, Se, Mn, Ti, Ni, and Fe.

22. The method according to claim 12, wherein the substrate is selected from the group consisting of a silicon substrate, a glass substrate, a silicon oxide substrate, a sapphire substrate, an indium tin oxide substrate , a quartz substrate, and a metal substrate.

23. The method according to claim 12, wherein the semiconductor nanorods are formed by a process selected from the group consisting of a chemical vapor deposition process, a sputtering process, a thermal evaporation process, an electron beam evaporation process, a pulse laser deposition process, and a vapor-phase transport process.

24. The method according to claim 12, wherein the semiconductor nanorods are formed by a metal organic chemical vapor deposition process.

25. The method according to claim 12, wherein the nitride semiconductor thin film is formed by a process selected from the group consisting of a metal organic chemical vapor deposition process, a molecular beam epitaxy process, and a hydride vapor phase epitaxy process.

26. The method according to claim 12, wherein forming the semiconductor nanorods comprises:
    loading the substrate into a reactor;
    injecting a first reactive precursor and a second reactive precursor into the reactor using carrier gases; and
    growing semiconductor nanorods having a rod shape on the substrate by causing a chemical reaction between the first and second reactive precursors at a predetermined temperature under a predetermined pressure.

27. The method according to claim 26, wherein the first reactive precursor is $Zn(CH_3)_2$ and the second reactive precursor is $O_2$.

28. The method according to claim 26, wherein the predetermined temperature ranges from 400 to 900° C., and the predetermined pressure ranges from $10^{-5}$ to 760 mmHg.

29. The method according to claim 12, wherein depositing the nitride semiconductor thin film comprises:
    loading the substrate having the semiconductor nanorods into a reactor;
    injecting a reactive precursor and a nitride source gas into the reactor using carrier gases; and
    depositing a nitride semiconductor thin film by causing a chemical reaction between the reactive precursor and the nitride source gas at a predetermined temperature under a predetermined pressure.

30. The method according to claim 29, wherein the reactive precursor is selected from the group consisting of trimethylgalium, triethylgalium, and $GaCl_3$, and the nitride source gas is one selected from the group consisting of $NH_3$, $N_2$, and tertiarybutylamine.

31. The method according to claim 30, wherein the predetermined temperature ranges from 300 to 1100° C., and the predetermined pressure ranges from $10^{-5}$ to 2000 mmHg.

32. The method according to claim 20, wherein the alloy is $Ga_{1-x}Al_{1-y}In_{1-z}N$, wherein $0 \leq x, y, z \leq 1$.

33. The device according to claim 9, wherein the alloy is $Ga_{1-x}Al_{1-y}In_{1-z}N$, wherein $0 \leq x, y, z \leq 1$.

34. The device according to claim 1, wherein the device further comprises at least one of the thin films on the nitride semiconductor thin film.

35. The method according to claim 12, wherein the method further comprises depositing at least one of the thin films on the nitride semiconductor thin film.

* * * * *